United States Patent
Dobyns

(10) Patent No.: US 6,178,359 B1
(45) Date of Patent: Jan. 23, 2001

(54) INSTRUMENT WITH INSTALLATION-EVIDENT ACCESSORY MODULES

(75) Inventor: Kenneth P. Dobyns, Beaverton, OR (US)

(73) Assignee: Tektronix, Inc., Beaverton, OR (US)

(*) Notice: Under 35 U.S.C. 154(b), the term of this patent shall be extended for 0 days.

(21) Appl. No.: 09/052,809

(22) Filed: Mar. 31, 1998

(51) Int. Cl.$^7$ .................................................. G06F 19/00
(52) U.S. Cl. ............................ 700/117; 700/86; 702/67; 600/398; 361/600
(58) Field of Search ................. 700/117, 86; 345/903, 345/905, 157; 702/67; 324/121, 156; 600/398, 474, 549; 361/600, 752, 683

(56) References Cited

U.S. PATENT DOCUMENTS

| | | | |
|---|---|---|---|
| 3,957,198 | * 5/1976 | Thomson | 235/1 |
| 4,168,870 | * 9/1979 | Hill | 312/244 |
| 4,563,575 | 1/1986 | Hoppe et al. | 235/492 |
| 4,790,761 | * 12/1988 | Sonobe | 439/59 |
| 4,872,139 | 10/1989 | Okamoto et al. | 365/52 |
| 5,363,578 | * 11/1994 | Chesley et al. | 40/488 |
| 5,598,318 | * 1/1997 | Dewitt et al. | 361/683 |
| 5,629,615 | * 5/1997 | Nita et al. | 324/121 R |
| 5,808,464 | * 9/1998 | Natori et al. | 324/121 R |
| 5,823,393 | * 10/1998 | Hafstrom | 222/130 |
| 5,847,955 | * 12/1998 | Mitchell et al. | 700/86 |
| 5,861,873 | * 1/1999 | Kikinis | 345/157 |
| 6,035,214 | * 3/2000 | Henderson | 455/683 |

FOREIGN PATENT DOCUMENTS

| | | |
|---|---|---|
| 0588 453 A1 | 3/1994 | (EP). |
| 0338371 | 10/1994 | (EP). |

OTHER PUBLICATIONS

Zhou et al., "A Portable Paratial Discharge Measureing System For Insulation Condition Monitoring", IEEE, pp. 557–560, Sep. 1998.*

Boulejfen et al., "An Automated N–Port Network Analyzer for Linear and Non Linear Multi–Port RF adn Digital Circuits", IEEE. pp. 36–39, May 1997.*

Lauterbach, "New 'Scope Tools Boost Circuit Dsign", IEEE, pp. 16–24, Mar. 1996.*

* cited by examiner

Primary Examiner—William Grant
Assistant Examiner—McDieunel Marc
(74) Attorney, Agent, or Firm—Bennet K. Langlotz; Thomas F. Lenihan

(57) ABSTRACT

An electronic instrument with a housing defining a module chamber. An electronic module is removably retained within the chamber and includes indicia such as text or a distinctive color on a selected surface of the module. The housing has a window aperture into the chamber, so that the module indicia are visible through the window to permit identification of the presence and identity of the module, even when the instrument is powered off. The module contains electronic circuitry that connects to electronic contacts of the instrument in the chamber.

12 Claims, 4 Drawing Sheets

INSTRUMENT WITH INSTALLATION-EVIDENT ACCESSORY MODULES

FIELD OF THE INVENTION

The invention relates to electrical instruments, and more particularly to instruments having optional and replaceable accessory software or hardware modules.

BACKGROUND OF THE INVENTION

Electronic instruments for computing, test, and measurement often use small accessory modules to provide addition functional features. Such features are not usually cost effective to include in a standard instrument, but are nevertheless desired by a limited portion of the instrument's users. These modules are typically sold as an option at additional cost, and may be purchased and added by the user at a later date, as the need arises. In addition, such modules can be replaceable, so that a module providing one specialized function can be removed, and a substitute module providing a different capability can replace it as needed.

Accessory modules sometimes include stored data or programs, or sometimes include hardware or circuitry. Typically, such modules are installed in an enclosed compartment at the rear or side of the instrument, so that scarce area on the front panels of such instruments is not wasted, allowing front panel area to be used for interface devices, switches, displays, and other elements requiring access during normal use.

While the positioning of modules where they are not normally visible does not present an undue inconvenience for users who only rarely need to add or remove modules, it makes it difficult for a user to readily determine whether and which modules are installed. Some instruments provide module presence information to a user operating the unit and making an appropriate query. However, this is inconvenient or impractical in some circumstances. For instance, in a large organization having an inventory of numerous similar instruments, a manager of the instrument depot or a user seeking to borrow an instrument sometimes needs to determine which of several dozen similar instruments contains the modules with the special capabilities required. It would be impractical to power up and query each instrument, and external labeling systems can be unaesthetic, outdated, and inconvenient.

SUMMARY OF THE INVENTION

The embodiments disclosed herein overcome these limitations by providing an electronic instrument with a housing defining a module chamber. An electronic module is removably retained within the chamber and includes indicia such as text or a distinctive color on a selected surface of the module. The housing has a window aperture into the chamber, so that the module indicia are visible through the window to permit identification of the presence and identity of the module, even when the instrument is powered off. The module contains electronic circuitry that connects to electronic contacts of the instrument in the chamber.

DETAILED DESCRIPTION OF A PREFERRED EMBODIMENT

Figure 1:
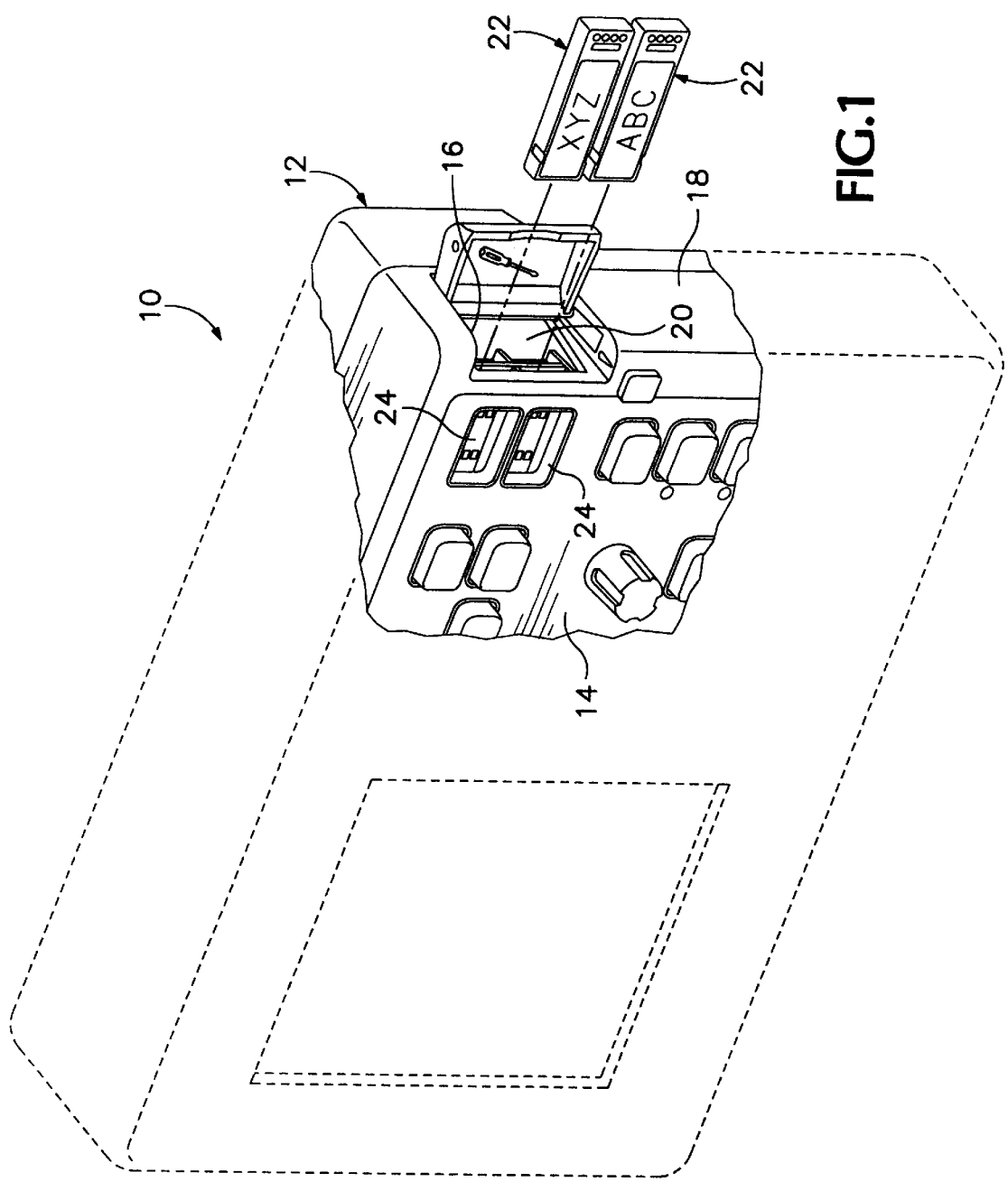
FIG. 1 is a perspective view of an instrument according to a preferred embodiment of the invention.

FIG. 1 shows an instrument 10 such as a portable digital oscilloscope having a plastic housing 12 that encloses electronic circuitry. The housing has a front panel 14 including a display, controls, connectors, and other features and printed indicia necessary for observation or use by a user during normal operation of the instrument.

The instrument housing has an access aperture 16 in a side panel 18 of the housing, and opening into an accessory chamber 20. The chamber receives optional removable electronic accessory modules 22. A pair of window apertures 24 are defined in the front panel in registration with the chamber, providing a user with a view of the chamber's contents.

Figure 2:
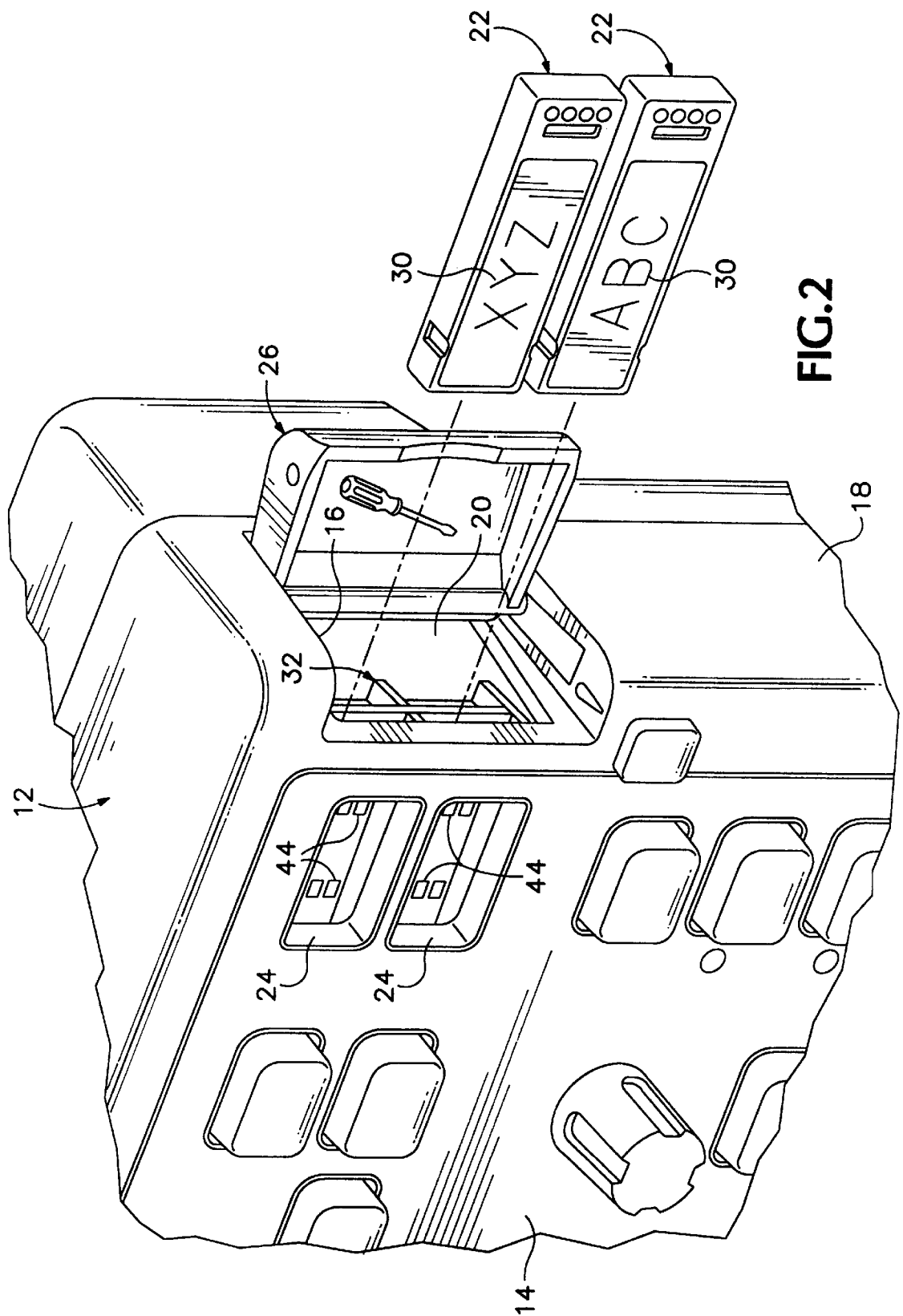
FIG. 2 is an enlarged perspective view of the instrument of FIG. 1.

As shown in FIG. 2, the access aperture is fitted with a door 26 that pivots between the open position shown, and a closed position (shown of FIGS. 3 and 5) in which the door is flush with the housing surface. The modules are elongated rectangular bodies that preferably function to enable software or hardware features already included in the instrument's circuitry. Alternatively, the modules can contain software code, data sets, or hardware capabilities. Each contains a semiconductor chip connected to electrical contacts (discussed below), and has an identifying label on a front surface. The label or surface includes indicia 30 informing the user of the module's identity or capabilities. The indicia may include text, numerals, symbols, illustrations, texture, patterns, color and shape, and may be molded into the module surface, as well as applied on a label.

Figure 3:
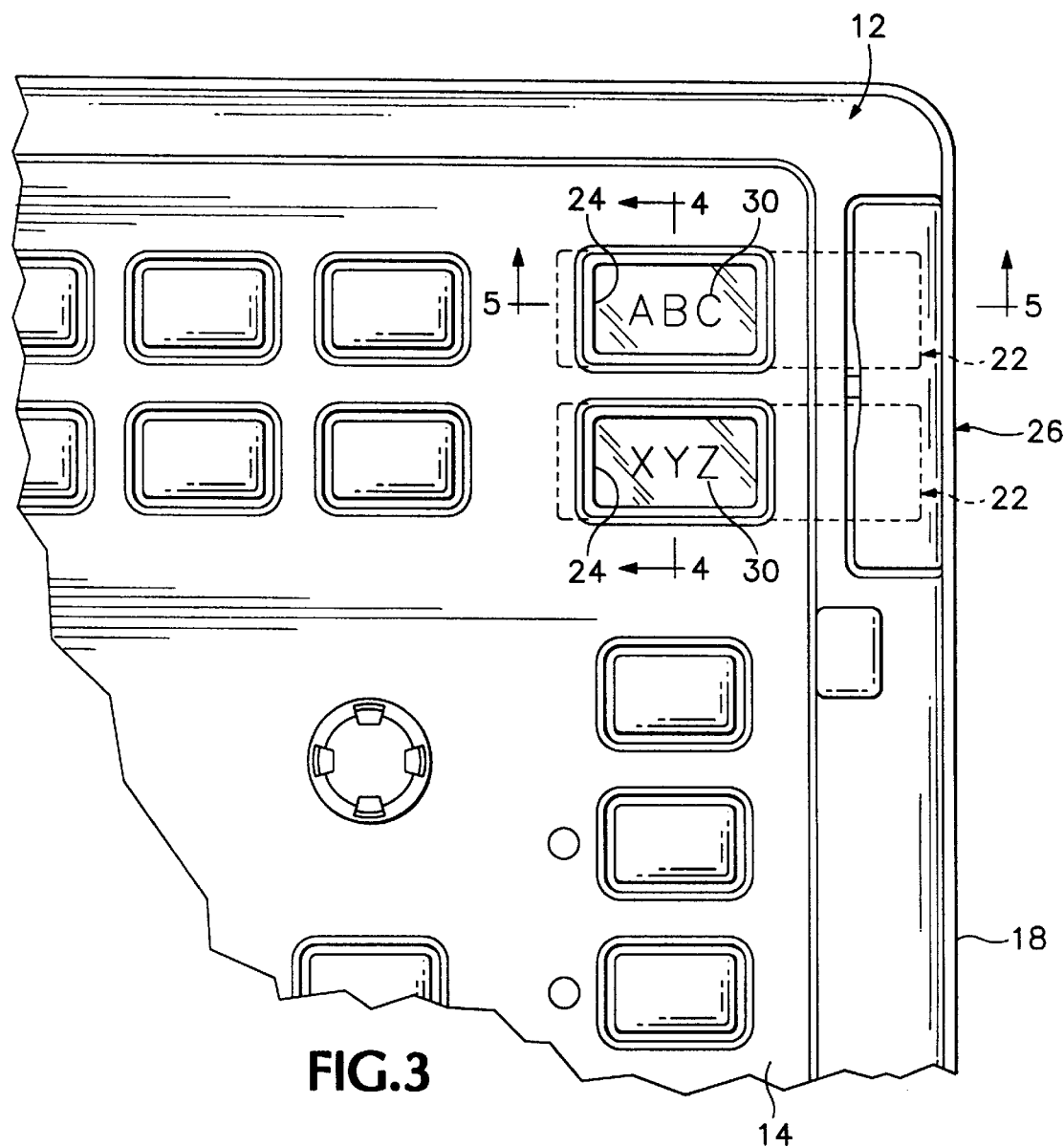
FIG. 3 is an enlarged front view of the instrument of FIG. 1.

As shown in FIG. 3, the modules are entirely contained in the housing when fully installed. The indicia 30 are fully visible through the windows 24, and the door 26 is closed to provide a flush housing surface. Except for the front edge of the door, which is accessible from the front panel, the access aperture 16 is largely positioned away from the front panel, to conserve front panel space.

Figure 4:
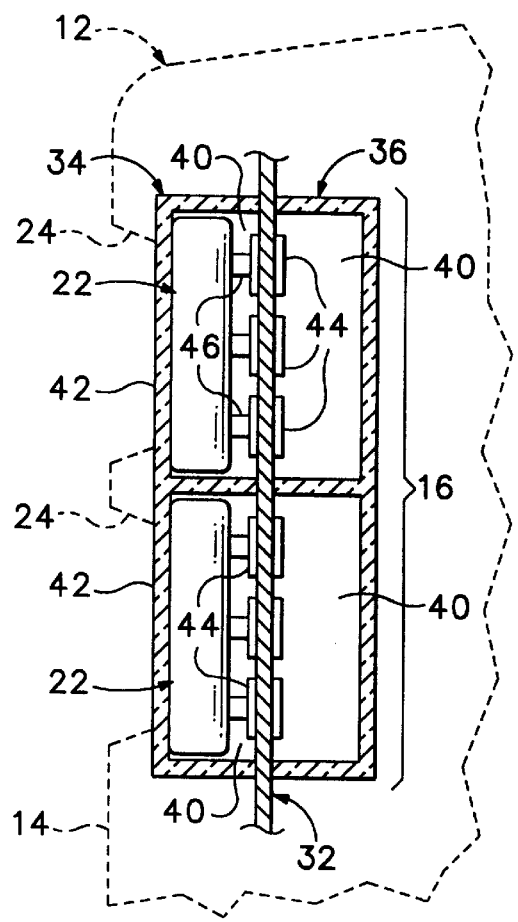
FIG. 4 is a sectional view of the instrument of FIG. 1 taken along line 4—4 of FIG. 3.

FIG. 4 shows a sectional view of the components within the chamber 16. A printed circuit board 32 parallel to the front panel 14 is electrically connected to other instrument circuitry, including front panel switch and display components that it supports. A pair of transparent plastic module guide elements 34, 36 are positioned on each side of the circuit board in the chamber. The guide elements each define a pair of parallel slots 40, each sized to closely receive a module. The slots are open ended at the end nearest the aperture 16 to permit module insertion, and closed ended at the other end to limit module insertion to the desired position. The front guide element 34 provides a transparent panel 42 through which installed modules may be viewed, and which provides a barrier against dust. The clear panel 42 also prevents unwanted user contact with instrument electronic components when modules are absent, as required for product safety certification. The slots defined by the rear guide 36 are not visible through the windows, but provide additional module capacity for users with unusual requirements.

Figure 5:
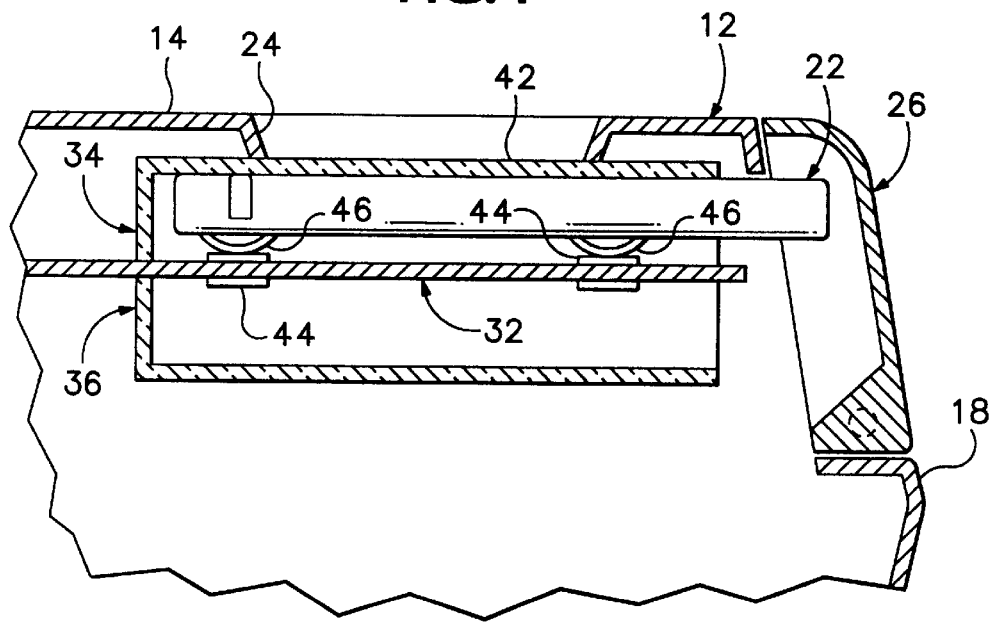
FIG. 5 is a sectional view of the instrument of FIG. 1 taken along line 5—5 of FIG. 3.

The electrical interface between modules and the board is shown in FIGS. 4 and 5. The printed circuit board 32 includes a set of conductive lands 44 (also shown in FIG. 2)

at each end of each module slot. The lands are registered with respective module spring contacts 46, so that the modules are connected to the circuitry by compressive contact as the module is captured within the slot. The slot thickness is slightly less than the thickness of the module (with contacts in an unbiased position) so that insertion biases the contacts to provide compression. The guides are secured mechanically to the circuit board to withstand the spring contact forces.

While the disclosure is made in terms of a preferred embodiment, the invention is not intended to be so limited. For instance, the windows can be provided to permit module identification through another instrument panel other than the front panel, such as a convenient top panel. The modules can be much larger components having major functional capabilities, instead of the minimal sized enabling modules.

What is claimed is:

1. An electronic test and measurement instrument comprising:
   an instrument housing for enclosing electronic circuitry, said housing having an exterior surface;
   the housing defining a module chamber;
   the housing exterior surface defining an access aperture for receiving an electronic module, wherein access to the chamber for installation and removal of said module is provided via the access aperture; and
   the housing exterior surface defining a window aperture, said window aperture being formed though said housing exterior surface at a position such that said module installed in the chamber can be visually identified through the window aperture;
   wherein installation of said module enables operation by a user of a feature included within said instrument and provides a visual indication of said enabling of said feature.

2. The instrument of claim 1 wherein the chamber includes an electronic contact, such that said electronic module inserted in the chamber is coupled to said circuitry of the instrument.

3. The instrument of claim wherein said visual indication includes text printed on said module.

4. The instrument of claim 1 wherein said visual indication includes color of said module.

5. The instrument of claim 1 wherein the module includes electronic information for enabling operation of an instrument operation.

6. The instrument of claim 1 wherein the exterior surface of said housing of said instrument defines a plurality of window apertures, such that a plurality of different modules are accommodated.

7. An electronic test and measurement instrument comprising:
   an instrument housing;
   an electronic circuit within the housing;
   the housing defining a module chamber for receiving a module, said chamber having an access aperture through which said module is installed and removed;
   the circuit including a plurality of electrical contacts within the chamber; and
   the housing defining a window aperture said window aperture being formed though said housing at a position such that said module installed in the chamber can be visually identified through the window aperture;
   wherein installation of said module enables operation by a user of a feature included within said instrument and provides a visual indication of said enabling of said feature.

8. The instrument of claim 7 wherein the window is defined in a front panel of the instrument housing.

9. The instrument of claim 8 wherein said access aperture is defined in a housing surface other than the front panel.

10. The instrument of claim 9 wherein the access aperture includes a door.

11. The instrument of claim 7 wherein the electrical contacts are conductive lands on a printed circuit board.

12. The instrument of claim 7 including an electronic module removably received within the chamber and including indicia on a module surface visible through the window.

* * * * *